US008431478B2

(12) United States Patent
Shen (10) Patent No.: US 8,431,478 B2
(45) Date of Patent: Apr. 30, 2013

(54) SOLDER CAP BUMP IN SEMICONDUCTOR PACKAGE AND METHOD OF MANUFACTURING THE SAME

(75) Inventor: Geng-Shin Shen, Tainan (TW)

(73) Assignee: ChipMOS Technologies, Inc., Hsinchu (TW)

( * ) Notice: Subject to any disclaimer, the term of this patent is extended or adjusted under 35 U.S.C. 154(b) by 119 days.

(21) Appl. No.: 13/234,842

(22) Filed: Sep. 16, 2011

(65) Prior Publication Data

US 2013/0069231 A1 Mar. 21, 2013

(51) Int. Cl.
*H01L 21/44* (2006.01)

(52) U.S. Cl.
USPC .......................................... 438/614; 257/738

(58) Field of Classification Search .................. 438/614; 257/738
See application file for complete search history.

(56) References Cited

U.S. PATENT DOCUMENTS

| | | | |
|---|---|---|---|
| 7,265,044 B2 * | 9/2007 | Ohta et al. | 438/612 |
| 7,476,564 B2 * | 1/2009 | Chen et al. | 438/107 |
| 7,902,666 B1 * | 3/2011 | Hsu et al. | 257/737 |
| 8,207,608 B2 * | 6/2012 | Chew et al. | 257/738 |
| 8,367,467 B2 * | 2/2013 | Jang et al. | 438/107 |
| 2001/0026021 A1 * | 10/2001 | Honda | 257/778 |
| 2001/0040290 A1 * | 11/2001 | Sakurai et al. | 257/737 |
| 2002/0163069 A1 * | 11/2002 | Lu et al. | 257/690 |
| 2003/0219926 A1 * | 11/2003 | Yuzawa | 438/106 |
| 2004/0185649 A1 * | 9/2004 | Huang et al. | 438/612 |
| 2005/0070084 A1 * | 3/2005 | Hsu et al. | 438/612 |
| 2005/0189650 A1 * | 9/2005 | Lee et al. | 257/738 |
| 2005/0194683 A1 * | 9/2005 | Yu et al. | 257/738 |
| 2006/0051954 A1 * | 3/2006 | Lin et al. | 438/614 |
| 2007/0048998 A1 * | 3/2007 | Hiatt et al. | 438/612 |
| 2008/0261390 A1 * | 10/2008 | Chen et al. | 438/613 |
| 2009/0111259 A1 * | 4/2009 | Verhaverbeke | 438/613 |
| 2009/0124075 A1 * | 5/2009 | Kang et al. | 438/614 |
| 2011/0003470 A1 * | 1/2011 | Burgess et al. | 438/614 |
| 2011/0156253 A1 * | 6/2011 | Tsai et al. | 257/738 |
| 2011/0193220 A1 * | 8/2011 | Kuo et al. | 257/737 |
| 2012/0129335 A1 * | 5/2012 | Ikumo et al. | 438/614 |
| 2012/0295434 A1 * | 11/2012 | Cho et al. | 438/614 |
| 2012/0326296 A1 * | 12/2012 | Choi et al. | 257/737 |

* cited by examiner

*Primary Examiner* — Jae Lee
*Assistant Examiner* — Grant Withers
(74) *Attorney, Agent, or Firm* — Chun-Ming Shih (57) ABSTRACT

A semiconductor package with improved height uniformity of solder cap bumps therein is disclosed. In one embodiment, the semiconductor package includes a semiconductor substrate comprising a plurality of pads spacedly disposed on a top surface of the substrate, and a passivation layer formed on top of the pads, wherein a plurality of pad openings are created to expose at least a portion of the pads; a plurality of solder cap bumps formed at the pad openings of the passivation layer; and a carrier substrate having a plurality of bond pads electrically connected to the solder caps of the solder cap bumps on the semiconductor substrate. The solder cap bump includes a solder cap on top of a conductive pillar, and a patternable layer can be coated and patterned on a top surface of the conductive pillar to define an area for the solder ball to be deposited. The deposited solder ball can be reflowed to form the solder cap.

12 Claims, 11 Drawing Sheets

SOLDER CAP BUMP IN SEMICONDUCTOR PACKAGE AND METHOD OF MANUFACTURING THE SAME

FIELD OF THE INVENTION

The present invention is related to a semiconductor package, and more particularly to a method for forming solder cap bumps with improved height uniformity to enhance reliability of the interconnection between a solder cap bump and a pad in the semiconductor package.

BACKGROUND OF THE INVENTION

With the remarkable advances in semiconductor technologies, the electronics industry has been through a very rapid revolution from thick to thin films and to ever increasing miniaturization. Semiconductor packaging, which is the science of establishing interconnections with the semiconductor devices to form circuits, has been developed concurrently with the rapid advances in the semiconductor and electronics industries. The main purpose of packaging is to ensure that the semiconductor devices and interconnections are packaged efficiently and reliably.

As miniaturization and high performance are demanded in electronic products (such as cell phones, laptops, personal digital assistants (PDAs) and the like), high-density integrated circuits are frequently arranged within compact semiconductor packages such as a flip-chip package and a ball grid array (BGA) package. For example, in BGA package, an array of solder balls is configured so that each solder ball contacts a corresponding ball-pad to define a "ball-grid" array. Electronic devices with ball-grid arrays are generally high capacity packages that have higher pin counts than conventional chip packages that use a lead frame.

FIGS. 1A to 1F illustrate schematic cross-sectional views of a conventional method of forming a solder bump. As shown in 1A, a wafer 110 is provided with an active surface 112, and the wafer also has a passivation layer 114 and a plurality of bonding pads 116. It is noted that the passivation layer 114 is patterned to expose the bonding pads 116. Furthermore, a metallic layer 120 is formed to cover the passivation layer 114 and the bonding pads 116. The metallic layer 120 is actually an interface between the bonding pads 116 and a subsequently formed conductive pillar 140 (see FIG. 1C).

Referring to FIGS. 1B to 1F, a patterned mask layer 130 is formed over the metallic layer 120 with a plurality of openings 132 located on top of the bonding pads 116 and at least a portion of the metallic layer 120 is exposed. An electroplating operation is performed to deposit conductive materials into the opening 132, and the exposed metallic layer 120 is used as a seed layer. A conductive pillar 140 is thus formed to partially fill the opening 132, and a cylindrical solder cap 150 is formed by conductive an electroplating operation or a printing operation. The mask layer 130 and a portion of the metallic layer 120 are removed, and a bump with a solder cap structure 160 is formed. It is noted that the solder cap may have a cylindrical shape 150 or a hemispherical shape 150a.

One disadvantage of conventional bump with solder cap formation is that only pure tin (Sn) or Sn (tin)/Ag (silver) alloy could be used in the electroplating operation. Practically, it is very difficult to perform electroplating for other different solder alloys. Furthermore, the volume of the solder cap during the electroplating operation is difficult to control, meaning that the height of each solder cap is not as uniform as desired. Also, the throughput for electroplating is much lower than solder "ball drop" technique. Therefore, there is a need for a new and improved method of forming solder cap bumps with more flexibility in the formation process, and the volume of the solder cap thereof can be more easily and precisely controlled.

SUMMARY OF THE INVENTION

It is an object of the present invention to provide a bump for a semiconductor package and a manufacturing process thereof where the size (volume) of a solder cap of the bump can be easily and precisely controlled to improve the height uniformity of the solder cap and further enhance the reliability of the interconnection between bump and the pad.

It is another object of the present invention to provide a bump for a semiconductor package and a manufacturing process thereof where more selections of the bump materials can be used to increase the flexibility of the manufacturing process of the semiconductor package.

It is a further object of the present invention to provide an array of solder balls that has higher throughput to lower the costs of the manufacturing process.

In one aspect, the present invention provides a method of forming solder cap bumps on a semiconductor device, the method comprising steps of, providing a semiconductor substrate having a plurality of pads spacedly disposed on a top surface of the substrate, and a passivation layer formed on top of the pads, wherein a plurality of pad openings are created to expose at least a portion of the pads; forming a plurality of conductive pillars at the pad openings of the passivation layer, so that the conductive pillar is electrically connected to the pad through the pad opening; depositing a patternable layer to cover the passivation layer and the conductive pillars, wherein the patternable layer has a plurality of pillar openings with predetermined size on top of the conductive pillars; disposing a solder ball in each pillar opening, wherein size of the solder ball is appropriated to and smaller than the predetermined size of the pillar opening; removing the patternable layer to expose the passivation layer, the conductive pillars, and the solder balls on the conductive pillars; and performing a reflow soldering on the solder ball to form a hemisphere solder cap on the conductive pillar. It is noted that a flux layer could be applied on the top surface of conductive pillar before depositing the solder ball.

In one embodiment, the conductive pillar can be an under bump metallization (UBM) layer having a height of 60 micrometer or less, and the UBM layer can be formed by electroplating. In another embodiment, the conductive pillars are made of a material selected from copper (Cu), gold (Au), and alloys thereof. In a further embodiment, the patternable layer could be a stencil layer or a photoresist layer. In still a further embodiment, the step of forming a plurality of conductive pillars at the pad openings of the passivation layer further includes steps of forming a metallization seed layer at the pad opening and forming the conductive pillars on the seed layer.

In another aspect of the present invention, a semiconductor package may include a semiconductor substrate comprising a plurality of pads spacedly disposed on a top surface of the substrate, and a passivation layer formed on top of the pads, wherein a plurality of pad openings are created to expose at least a portion of the pads; a plurality of solder cap bumps, comprising (a) a plurality of conductive pillars at the pad openings of the passivation layer, so that the conductive pillars are electrically connected to the pad through the pad opening, wherein a plurality of pillar openings with predetermined size are formed on a patternable layer that is on top of the conductive pillars, and a solder ball is deposited in each pillar opening corresponding to the size of the pillar opening; and (b) a solder cap located at a top surface of each conductive pillar, wherein a reflow soldering is performed on the solder ball to form the solder cap; and a carrier substrate having a plurality of bond pads electrically connected to the solder cap bumps on the semiconductor substrate.

In one embodiment, the semiconductor package further comprises an encapsulant filling the gap the carrier substrate and semiconductor substrate. In another embodiment, the conductive pillar is a conductive under bump metallization (UBM) structure. In still another embodiment, the conductive pillars or UBMs are made of a material selected from copper, gold and alloys thereof. In a further embodiment, the width of a bottom of the solder cap is appropriated to the size of top surface of the conductive pillar or UBM. In still a further embodiment, the semiconductor package further comprises a conductive trace electrically connecting the conductive pillar and the pad of the semiconductor substrate. It is noted that a flux layer could be applied on the top surface of conductive pillar or UBM before depositing the solder ball.

In a further aspect of the present invention, a manufacturing process of forming a flip chip package, said manufacturing process comprising steps of providing a semiconductor substrate having a plurality of pads spacedly disposed on a top surface of the substrate, and a passivation layer formed on top of the pads, wherein a plurality of pad openings are created to expose at least a portion of the pads; forming a plurality of conductive under bump metallization (UBM) structures at the pad openings of the passivation layer to electrically connect to the pad through the pad opening; depositing a patternable layer to cover the passivation layer and the conductive UBM structures, wherein the patternable layer has a plurality of UBM openings with predetermined size on top of the conductive UBM structures; disposing a solder ball in each UBM opening, wherein size of the solder ball is appropriated to and smaller than the predetermined size of the UBM opening; removing the patternable layer to expose the passivation layer, the conductive UBM structures, and the solder balls thereon; performing a reflow soldering on the solder ball to form a hemisphere solder cap on the UBM structure; and providing a carrier substrate having a plurality of bond pads, wherein the bond pad positions is corresponding the position of conductive UBM structure of the semiconductor substrate, and electrically connecting the carrier substrate and semiconductor substrate by bonding the solder cap of the semiconductor substrate and the bond pad of the carrier substrate.

In one embodiment, the manufacturing process further comprises a step of filling a gap between the semiconductor substrate and the carrier substrate with an encapsulant. In another embodiment, the conductive UBM structure is formed by electroplating, and the conductive UBM structures are made of a material selected from copper (Cu), gold (Au), and alloys thereof. In a further embodiment, the patternable layer is a stencil layer or a photoresist layer. In still a further embodiment, the step of forming a plurality of conductive UBM structures at the pad openings of the passivation layer further includes steps of forming a metallization seed layer at the pad opening and forming the conductive UBM structures on the seed layer.

The present invention together with the above and other advantages may best be understood from the following detailed description of the embodiments of the invention illustrated in the drawings below.

DETAILED DESCRIPTION OF THE INVENTION

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

All publications mentioned are incorporated by reference for the purpose of describing and disclosing, for example, the designs and methodologies that are described in the publications that might be used in connection with the presently described invention. The publications listed or discussed above, below and throughout the text are provided solely for their disclosure prior to the filing date of the present application. Nothing herein is to be construed as an admission that the inventors are not entitled to antedate such disclosure by virtue of prior invention.

As stated above, electroplating is used for conventional solder bump formation. Since only pure tin (Sn) or Sn (tin)/Ag (silver) alloy could be used in the electroplating operation and it is difficult to perform electroplating for other different solder alloys, the selection of electroplating materials becomes very limited. Furthermore, the volume of the solder cap during the electroplating operation is hard to control, so the height of the solder cap may not be uniform and the interconnection between some bumps and pads may not be properly formed. Also, as to the throughput, electroplating is much lower than other techniques, such as solder ball drop. Therefore, there is a need for a new and improved semiconductor package and method to overcome above-mentioned deficiencies during conventional solder bump formation process using electroplating.

Figure 1A:
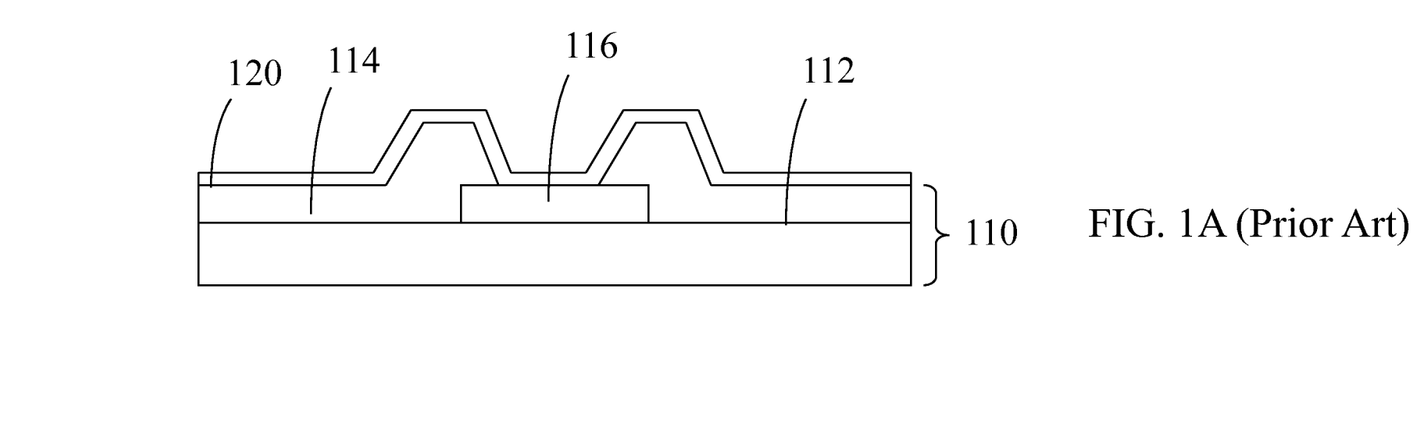
FIGS. 1A to 1F illustrate a conventional process for manufacturing bumps with solder caps.
Figure 1B:
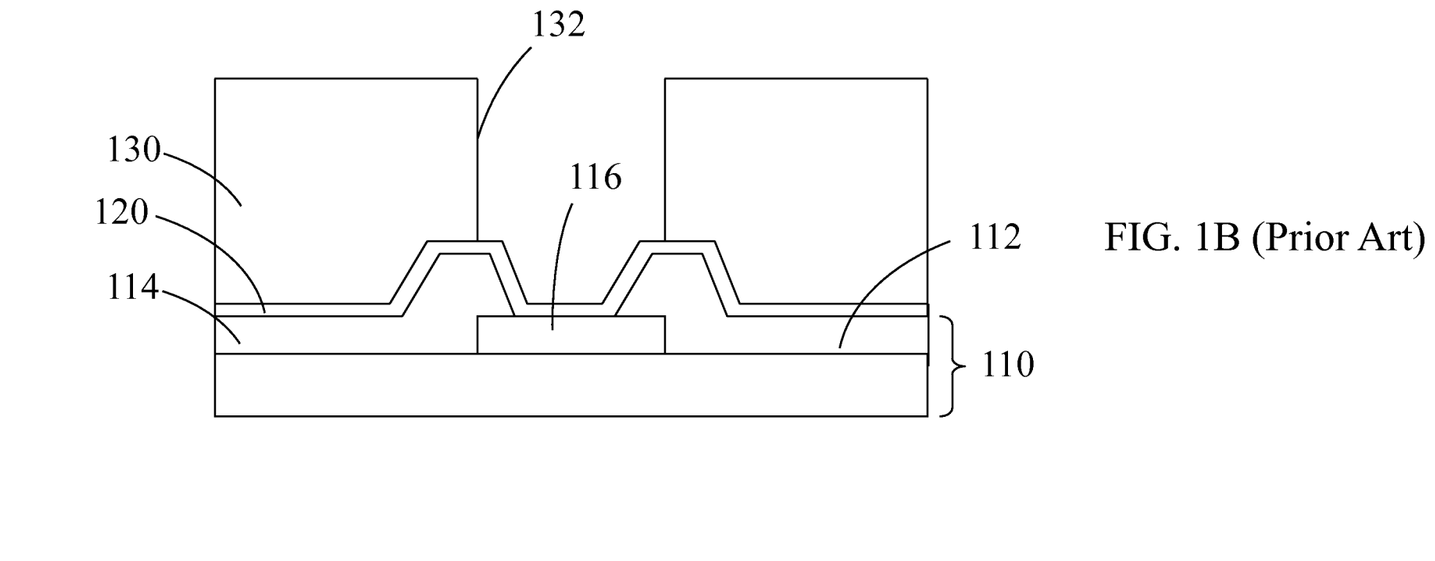
Figure 1C:
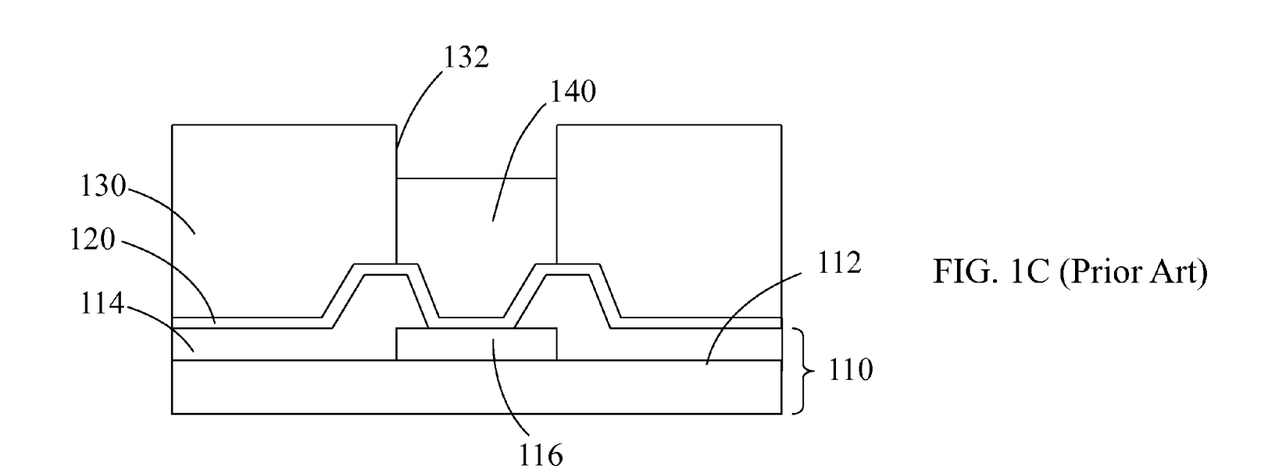
Figure 1D:
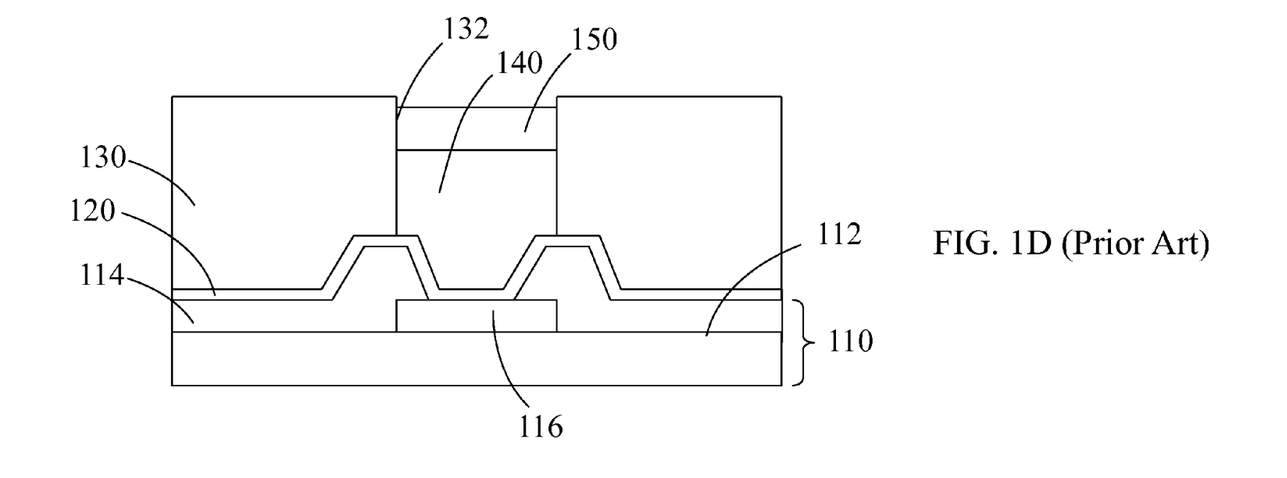
Figure 1E:
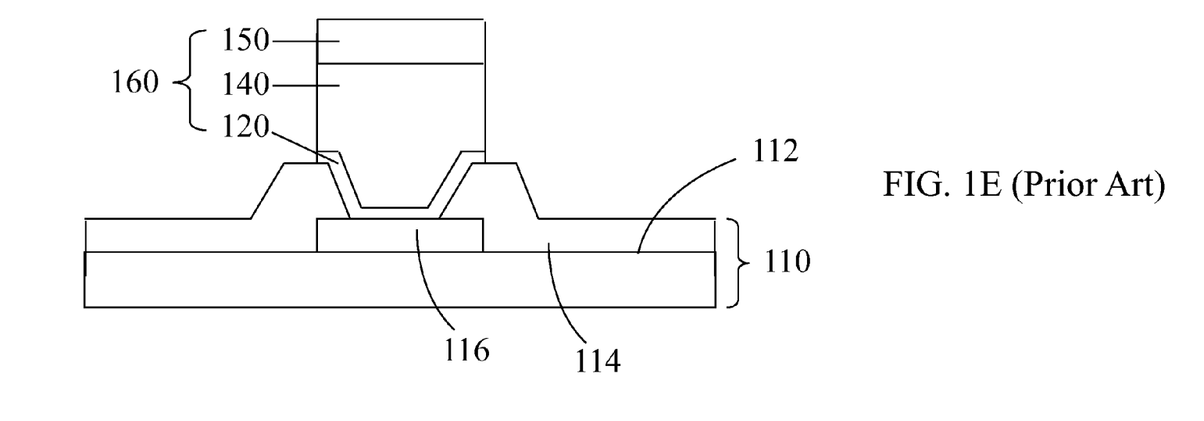
Figure 1F:
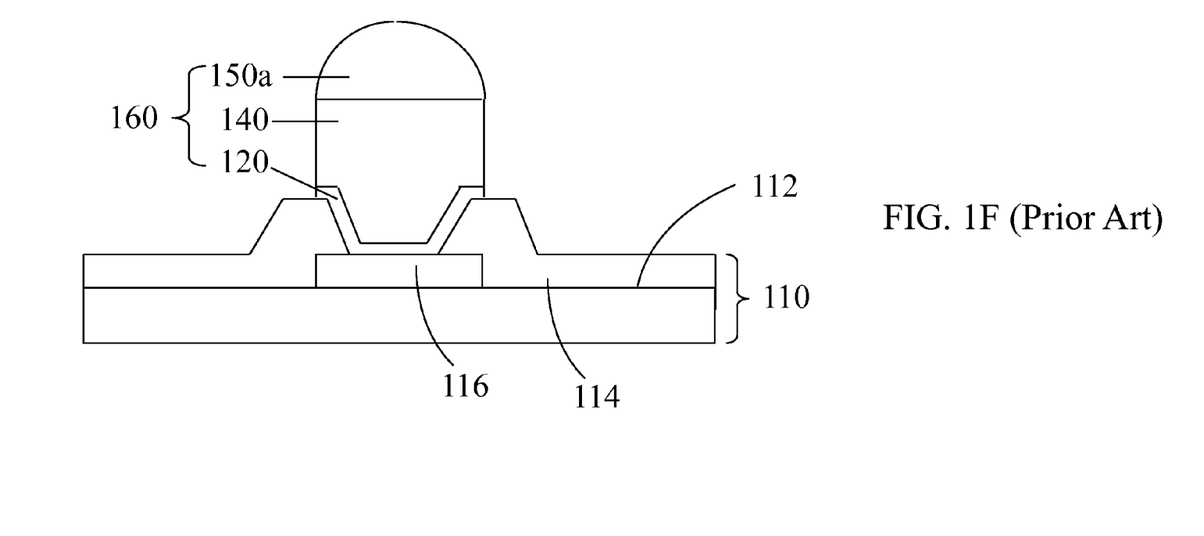
Figure 2A:
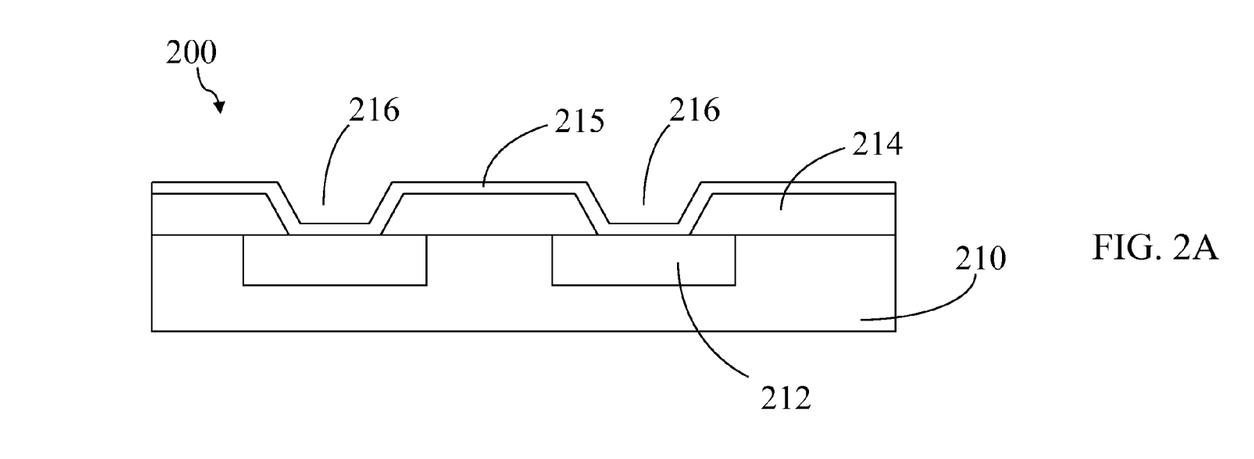
FIGS. 2A and 2E illustrate a method of forming solder cap bumps with improved height uniformity in the present invention.

Referring to FIG. 2A, a semiconductor device 200 comprises a semiconductor substrate 210, a plurality of pads 212 spacedly deposited on a top surface of the semiconductor substrate 210 by chemical vapor deposition (CVD), plasma-enhanced chemical vapor deposition (PECVD), or physical vapor deposition (PVD) (sputtering or evaporation); and a passivation layer 214 coated on the top surface of the semiconductor substrate 210. In the area of microelectronics, an oxide layer is often used as a passivation layer. The passivation layer 214 is then patterned to expose at least a portion of the pads 212, and a metallic layer 215 is deposited onto the passivation layer 214, wherein a portion of the metallic layer 215 directly contacts the exposed portion of pad 212, and an openings 216 is formed at the position where the metallic layer 215 the pads 212 are connected.

Figure 2B:
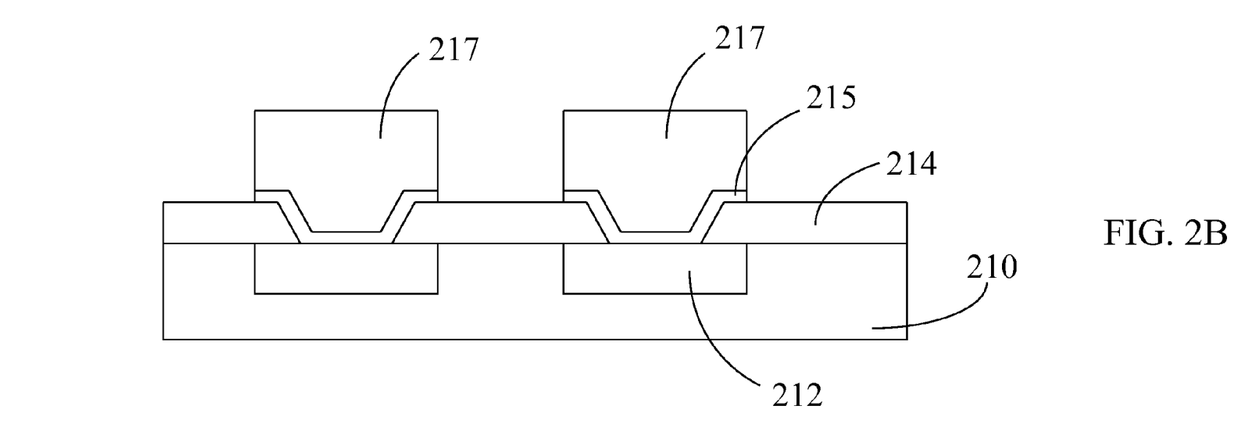

As can be seen in FIG. 2B, the metallic layer 215 is patterned to form a seed layer for electroplating and a plurality of conductive pillars 217 are formed on the seed layers, so the conductive pillars 217 are electrically connected with the pads 212. The seed layer is usually located between the conductive pillar 217 and pad 212 to facilitate the electroplating process. As to the material of the conductive pillar, the conductive pillar 217 can be made of copper (Cu), gold (Au) and alloys thereof. In an exemplary embodiment, the conductive pillar 217 in the present invention may be an under bump metallization (UBM) layer if the height of the conductive pillar 217 is 60 micrometer (μm) or less.

Figure 2C:
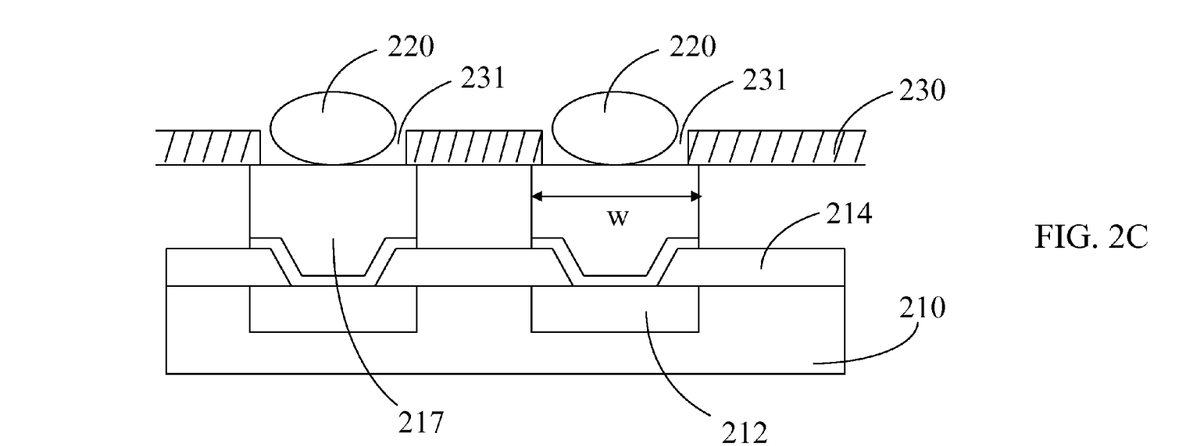
Figure 2D:
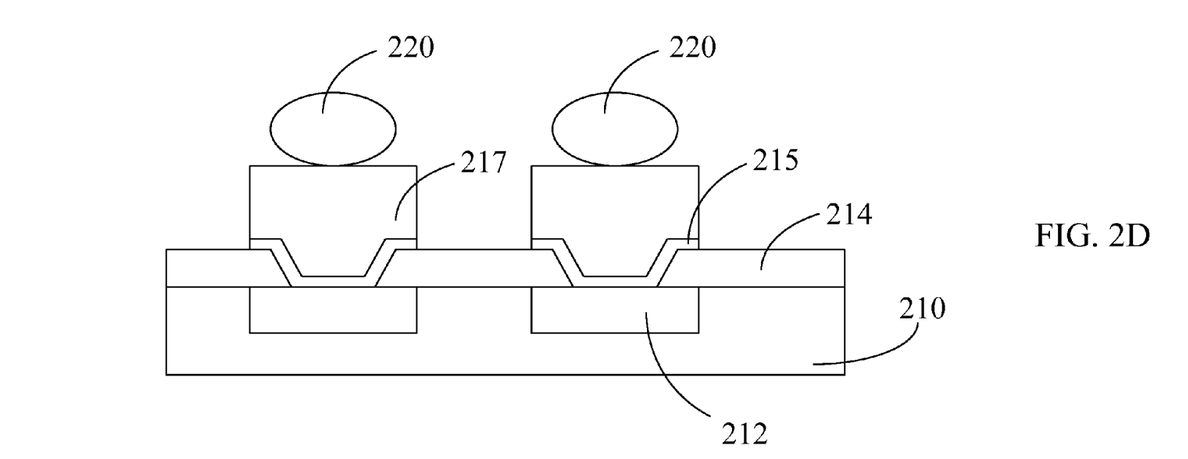

As mentioned above, solder cap uniformity may significantly affect the interconnection between bumps and pads. In order to better control the solder cap uniformity, namely the volume of the solder cap, a patternable layer 230 is introduced in the present invention. The patternable layer 230 is configured to not only precisely position the solder ball on top of the conductive pillar, but also control the volume of the solder ball. As can be seen in FIG. 2C, the patternable layer 230 is deposited onto of the passivation layer 214 and the conductive pillars 217, and subsequently patterned to form a solder ball opening 231 to expose at least a portion of a top surface of the conductive pillar 217. In one embodiment, a flux layer on the top surface of the conductive pillar before solder ball forming on the pillar (not shown) would be better for the solder ball quality during subsequent reflow process. In another embodiment, the size of the solder ball opening 231 is slightly smaller than the width (w) of the top surface of the conductive pillar 217. A solder ball 220 is then disposed onto the top surface of the conductive pillar 217, and the patternable layer is removed (see FIG. 2D). In some embodiments, the patternable layer 230 is a stencil layer. In other embodiments, the patternable layer 230 is a photoresist layer. It is noted that the size (volume) of the solder ball can be determined by considering a plurality of parameters, which will be detailed in FIG. 4.

Figure 2E:
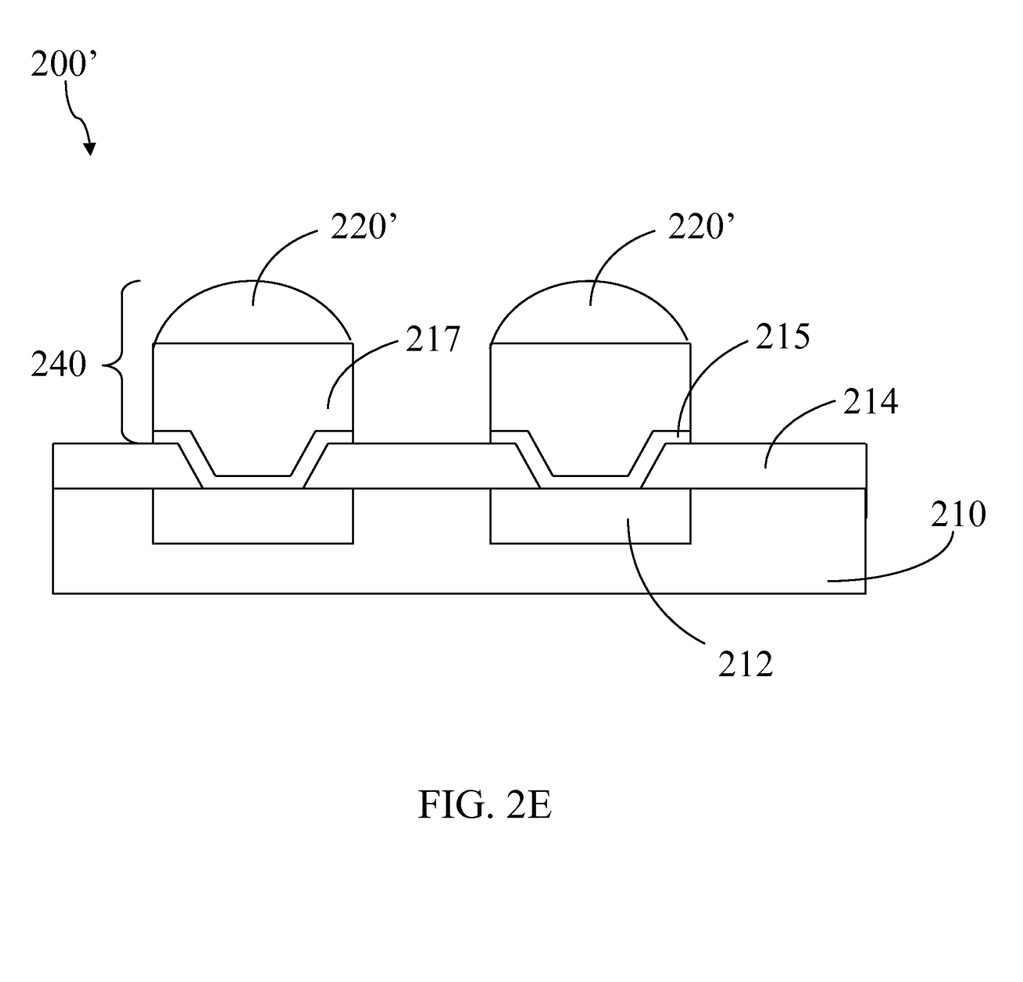

As shown in FIG. 2E, a solder cap bump 240 is formed through a melting or reflow soldering process. More particularly, during the reflow soldering process, the solder ball 220 is melted to form a solder cap 220' having a hemisphere or cap profile over the top surface of the conductive pillar 217 and a bonding structure 200' with uniform bump height is thus formed.

Figure 3A:
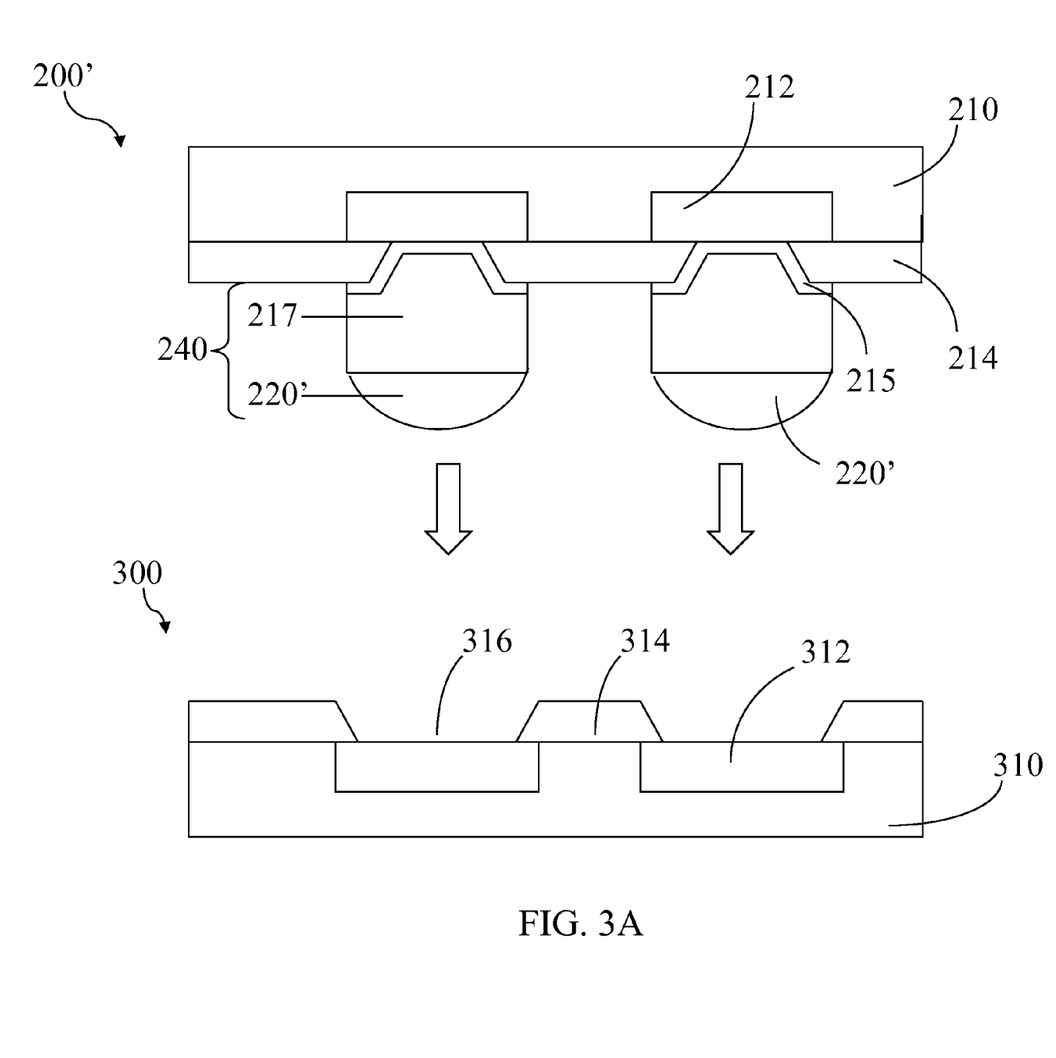
FIGS. 3A to 3B illustrate a schematic sectional view of a flip chip semiconductor package having solder cap bumps with improved height uniformity in the present invention.
Figure 3B:
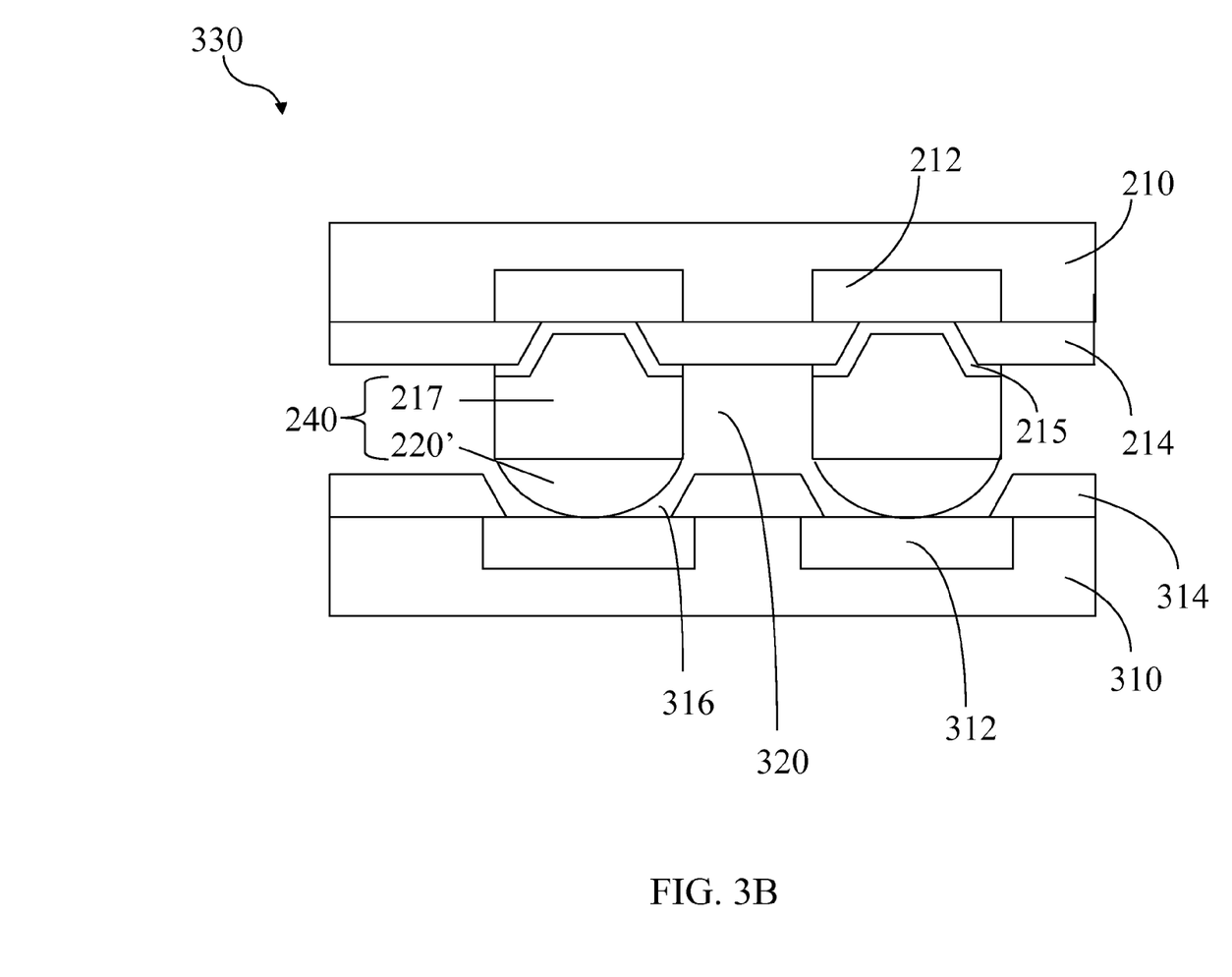

Recently, flip-chip mounting has become a popular technique for directly and electrically connecting an integrated circuit chip to a substrate. More specifically, during the manufacturing process, solder bumps are deposited on the top side of the chip surface and the chip is flipped over, so that the electrical bond pads on the chip can be aligned with corresponding electrical bond pads on the substrate. The flip chip and the substrate are then heated to cause the solder to melt and wet the electrical bond pads of the substrate to complete the interconnection. The substrate and flip chip are then cooled to solidify the solder thereby forming the desired electrical connections. According to an exemplary embodiment in the present invention, a flip-chip package 330 is being formed when the bonding structure 200' is flipped over to bond with a carrier substrate 310, as shown in FIGS. 3A and 3B. The carrier substrate 300 may include a semiconductor substrate 310, a plurality of bond pads 312 deposited on a top surface of the semiconductor substrate 310, and a passivation layer 314 coated on top of the bond pads 312 and the semiconductor substrate 310. A plurality of pad openings 316 are formed by patterning the passivation layer 314 to expose at least a portion of the bond pads 312. The size of the pad opening 316 may be determined by the size of the solder cap 220' of the solder cap bump 240. A solder paste would be applied on the pad opening 316 (not shown) to assist the solder cap joint the pad during the further reflow process.

As illustrated in FIG. 3B, the bonding structure 200' is lowered and the solder cap 220' is disposed into the pad opening 316 to electrically connect with the bond pad 312. It is noted that since the volume of the solder ball 220 can be controlled and predetermined by the patternable layer 230 in the present invention, the uniformity of the height of the solder cap 220' and the solder cap bump 240 is significantly improved, which leads to better interconnection between the solder caps 220' and the bond pads 312, and further enhances the reliability of the semiconductor package.

Still referring to FIG. 3B, an encapsulating material, such as epoxy, can be introduced into a gap 320 between the semiconductor substrate 210 and the carrier substrate 310 to seal and protect circuit components and assemblies from potentially damaging conditions such as moisture, corrosive chemicals, excessive heat, vibration, mechanical impact and abrasion which might occur while the device is in operation.

Figure 4:
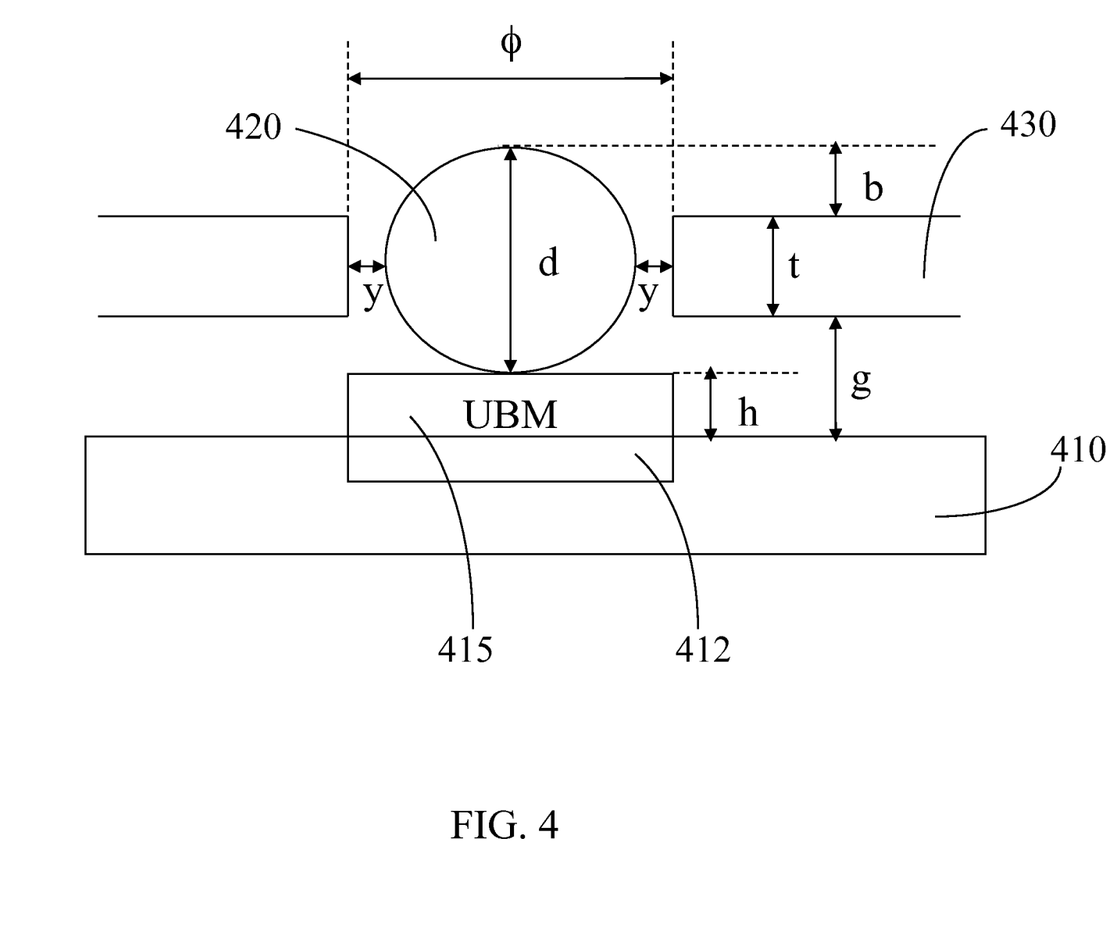
FIG. 4 depicts a schematic view of geometries and dimensions to determine the size of the solder ball in the present invention.

As described above, the size (volume) of the solder ball can be controlled and predetermined in the present invention to achieve the goal of good height uniformity of the solder cap. FIG. 4 illustrates a schematic view of a few important parameters that should be considered to determine the volume of the solder ball in the present invention. Here, d is the diameter of a solder ball 420, t is the thickness of a patternable layer 430, h is the height of a UBM structure, g is the distance from a bottom of the patternable layer 430 to a top surface of a substrate 410, b is the distance from a top surface of the patternable layer 430 to a top end of the solder ball 420 (i.e. ball overhead), and φ is the width of UBM opening of the patternable layer 430.

According to the geometries shown in FIG. 4, we can get an equation: d+h=t+g+b, so t=d+h−g−b. In common practice, the height of the UBM structure is not significant and may be ignored compare with solder ball diameter, so we can get a formula to determine the maximum thickness ($t_{max}$) of the patternable layer 430 as following:

$$t_{max}=d-g-b \quad (1)$$

As to the width of UBM opening φ, it is slightly larger than the diameter d of the solder ball, and can be determined by a formula as:

$$\phi=d+2y+\eta \quad (2)$$

where d is the diameter of the solder ball, y is the gap from the solder ball to each end of the patternable layer (see FIG. 4), and η is the diameter deviation of the solder ball. For example, if the solder ball diameter (d) is 200 μm, the gap (y) is 10 μm, and the diameter deviation (η) is about 5 μm, the UBM opening φ is 200+2×10+5=225 μm according to formula (2) presented above. As to the ball overhead b, it is usually about 15% of the diameter (d) of the solder ball.

Figure 5:
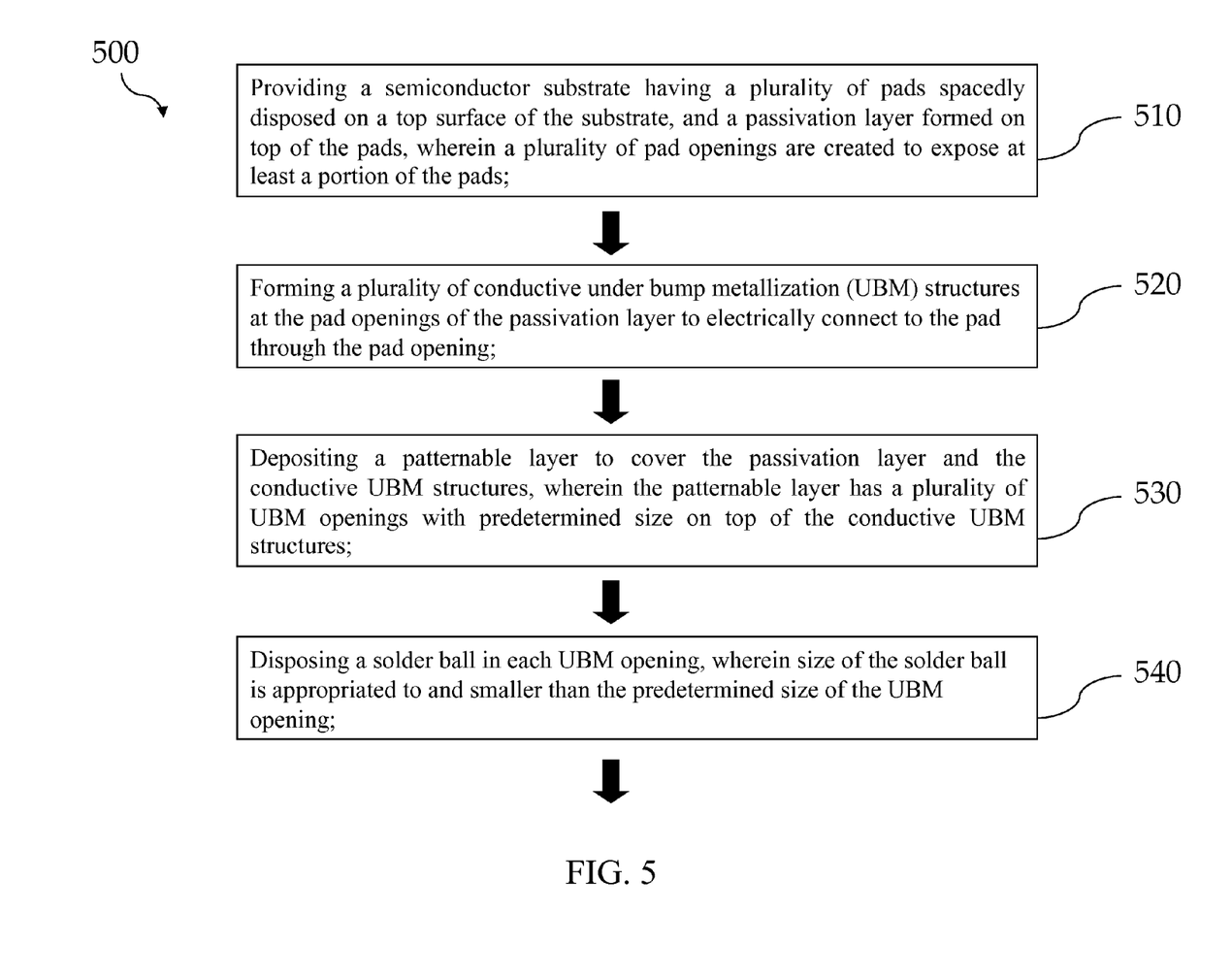
FIG. 5 shows a manufacturing process of a flip chip package using solder cap bumps with improved height uniformity in the present invention.

According to another aspect of the present invention shown in FIG. 5, a manufacturing process (500) of forming a flip chip package comprises steps of providing a semiconductor substrate having a plurality of pads spacedly disposed on a top surface of the substrate, and a passivation layer formed on top of the pads, wherein a plurality of pad openings are created to expose at least a portion of the pads (510); forming a plurality of conductive under bump metallization (UBM) structures at the pad openings of the passivation layer to electrically connect to the pad through the pad opening (520); depositing a patternable layer to cover the passivation layer and the conductive UBM structures, wherein the patternable layer has a plurality of UBM openings with predetermined size on top of the conductive UBM structures (530); disposing a solder ball in each UBM opening, wherein size of the solder ball is appropriated to and smaller than the predetermined size of the UBM opening (540); removing the patternable layer to expose the passivation layer, the conductive UBM structures, and the solder balls thereon (550); performing a reflow soldering on the solder ball to form a hemisphere solder cap on the conductive UBM (560); and providing a carrier substrate having a plurality of bond pads, wherein the bond pad positions is corresponding the position of conductive UBM structure of the semiconductor substrate, and electrically connecting the carrier substrate and semiconductor substrate by bonding the solder cap of the semiconductor substrate and the bond pad of the carrier substrate (570).

The manufacturing process (500) of forming a flip chip package may further include a step of filling a gap between the semiconductor substrate and the carrier substrate with an encapsulant (580). In one embodiment, the step of forming a plurality of conductive UBM structures at the pad openings of the passivation layer (520) further includes steps of forming a metallization seed layer at the pad opening and forming the conductive UBM structures on the seed layer. In another embodiment, the UBM structure is formed by electroplating, and the conductive UBM structures are made of a material selected from copper (Cu), gold (Au), and alloys thereof. In a further embodiment, the patternable layer that is used to determine the size of the solder ball is a stencil layer. In some embodiments, the patternable layer is a photoresist layer.

Having described the invention by the description and illustrations above, it should be understood that these are exemplary of the invention and are not to be considered as limiting. Accordingly, the invention is not to be considered as limited by the foregoing description, but includes any equivalent.

What is claimed is:

1. A method of forming solder cap bumps on a semiconductor device, said method comprising steps of:
   providing a semiconductor substrate having a plurality of pads spacedly disposed on a top surface of the substrate, and a passivation layer deposited on top of the pads, wherein a plurality of pad openings are created to expose at least a portion of the pads;
   forming a plurality of conductive pillars at the pad openings of the passivation layer, so that the conductive pillar are electrically connected to the pads through the pad openings;
   depositing a patternable layer to cover the passivation layer and the conductive pillars, wherein the patternable layer has a plurality of pillar openings with predetermined size on top of the conductive pillars;
   disposing a solder ball in each pillar opening, wherein size of the solder ball is appropriated to and smaller than the predetermined size of the pillar opening;
   removing the patternable layer to expose the passivation layer, the conductive pillars, and the solder balls on the conductive pillars; and
   performing a reflow soldering on the solder ball to form a hemisphere solder cap on the conductive pillar, and further form the solder cap bump.

2. The method of forming solder cap bumps on a semiconductor device of claim 1, wherein the conductive pillar are an under bump metallization (UBM) structure.

3. The method of forming solder cap bumps on a semiconductor device of claim 1, wherein the step of forming a plurality of conductive pillars at the pad openings of the passivation layer further includes steps of forming a metallization seed layer at the pad opening and forming the conductive pillars on the seed layer by electroplating.

4. The method of forming solder cap bumps on a semiconductor device of claim 3, wherein the conductive pillar is made of a material selected from copper (Cu), gold (Au), and alloys thereof.

5. The method of forming solder cap bumps on a semiconductor device of claim 1, wherein the patternable layer is a stencil layer or a photoresist layer.

6. The method of forming solder cap bumps on a semiconductor device of claim 1, wherein the conductive pillar are an under bump metallization (UBM) structure, and the height of the UBM structure is equal or less than 60 micrometer ($\mu m$).

7. A manufacturing process of forming a flip chip package, said manufacturing process comprising steps of:
   providing a semiconductor substrate having a plurality of pads spacedly disposed on a top surface of the substrate, and a passivation layer formed on top of the pads, wherein a plurality of pad openings are created to expose at least a portion of the pads;
   forming a plurality of conductive under bump metallization (UBM) structures at the pad openings of the passivation layer to electrically connect to the pads through the pad openings;
   depositing a patternable layer to cover the passivation layer and the conductive UBM structures, wherein the patternable layer has a plurality of UBM openings with predetermined size on top of the conductive UBM structures;
   disposing a solder ball in each UBM opening, wherein size of the solder ball is appropriated to and smaller than the predetermined size of the UBM openings;
   removing the patternable layer to expose the passivation layer, the conductive UBM structures, and the solder balls thereon;
   performing a reflow soldering on the solder ball to form a hemisphere solder cap on each conductive UBM structure; and
   providing a carrier substrate having a plurality of bond pads, wherein the bond pad is configured to bond the solder cap of the conductive UBM structure to electrically connect the carrier substrate and semiconductor substrate.

8. The manufacturing process of forming a flip chip package of claim 7, further comprising a step of filling a gap between the semiconductor substrate and the carrier substrate with an encapsulant.

9. The manufacturing process of forming a flip chip package of claim 7, wherein the under bump metallization (UBM) structure is 60 micrometer ($\mu m$) or less.

10. The manufacturing process of forming a flip chip package of claim 7, wherein the step of forming a plurality of conductive UBM structures at the pad openings of the passivation layer further includes steps of forming a metallization seed layer at the pad opening and forming the conductive UBM structure on the seed layer by electroplating.

11. The manufacturing process of forming a flip chip package of claim 10, wherein the conductive UBM structure is made of a material selected from copper (Cu), gold (Au), and alloys thereof.

12. The manufacturing process of forming a flip chip package of claim 7, wherein the patternable layer is a stencil layer or a photoresist layer.

\* \* \* \* \*